United States Patent [19]
Srivastava et al.

[11] Patent Number: 6,097,187
[45] Date of Patent: Aug. 1, 2000

[54] MRI MAGNET WITH FAST RAMP UP CAPABILITY FOR INTERVENTIONAL IMAGING

[75] Inventors: Vishnu Srivastava, Highland Hts.; Gordon D. DeMeester, Wickliffe; Michael A. Morich, Mentor, all of Ohio

[73] Assignee: Picker International, Inc., Highland Heights, Ohio

[21] Appl. No.: 08/915,624

[22] Filed: Aug. 21, 1997

[51] Int. Cl.[7] .................................................. G01V 3/00
[52] U.S. Cl. ........................................... 324/320; 324/319
[58] Field of Search .................... 324/318, 319, 324/320, 322; 505/844; 335/216, 296, 297, 299

[56] References Cited

U.S. PATENT DOCUMENTS

| | | | |
|---|---|---|---|
| 2,962,636 | 11/1960 | Purcell | 317/158 |
| 4,359,706 | 11/1982 | Flack | 335/281 |
| 4,553,122 | 11/1985 | Young | 335/296 |
| 4,656,449 | 4/1987 | Mallard et al. | 335/297 |
| 4,875,485 | 10/1989 | Matsutani | 324/307 |
| 4,931,735 | 6/1990 | Overweg et al. | 324/320 |
| 4,985,678 | 1/1991 | Gangarosa et al. | 324/318 |
| 5,235,282 | 8/1993 | Overweg et al. | 324/318 |
| 5,361,054 | 11/1994 | Knuttel | 335/216 |
| 5,633,588 | 5/1997 | Hommei et al. | 324/320 |

OTHER PUBLICATIONS

Outlook Magnet Resonance Imaging System Product Data advertising brochure, Picker International, Dec. 1995.

*Primary Examiner*—Louis Arana
*Attorney, Agent, or Firm*—Fay, Sharpe, Fagan, Minnich & McKee, LLP

[57] ABSTRACT

Primary superconducting coils (50) generate a magnetic field through an examination region (10). Stabilizing coils (70) are magnetically coupled with the magnetic field generated by the primary coils. A primary persistence switch (60) and a stabilizing coils persistence switch (72) are opened when the primary coils are connected to a current source (62) to ramp-up the magnetic field. The persistence switches are closed, disconnecting the primary coils from the current source and connecting the primary coils and the stabilizing coils into closed loops. As the magnetic flux generated by the primary coils fluctuates as the primary coils stabilize, the changing flux induces currents in the stabilizing coils. The currents induced in the stabilizing coils generate an offsetting magnetic flux such that the net magnetic flux generated by the primary and stabilizing coils is held constant.

20 Claims, 3 Drawing Sheets

MRI MAGNET WITH FAST RAMP UP CAPABILITY FOR INTERVENTIONAL IMAGING

BACKGROUND OF THE INVENTION

The present invention relates to the art of generating magnetic fields, particularly strong uniform magnetic fields. It finds particular application in conjunction with magnetic resonance imaging and will be described with particular reference thereto. However, it is to be appreciated that the invention will also find application with magnetic resonance spectroscopy, and other medical and diagnostic techniques, and the like.

As the use of magnetic resonance imaging ("MRI") techniques expands, there is an increased interest in bringing equipment (including equipment for other imaging modalities, interventional surgery, heart/lung machines, emergency oxygen tanks, etc.) into a room with an MRI imager. However, the equipment is frequently not compatible with the magnetic field produced by the MRI imager. Under those circumstances, discharging the magnet in the MRI imager may be appropriate before the equipment is introduced into the room. Then, when additional images are desired, the MRI magnet would be ramped-up after the interfering equipment is removed from the room. Therefore, it is desirable to charge and discharge the MRI magnet quickly.

Heretofore, smaller magnets, e.g., 0.5 T with a minimum inductance design have been used for imaging during interventional surgery. Both resistive and cryogenic magnets require a stabilization time after being brought back up to field, i.e. ramped-up. In cryogenic magnets, the superconducting wire commonly includes a copper matrix with embedded, twisted strands of type II superconductor. During energization or de-energization, current is transferred between the copper and the superconducting strands. Current in the copper has a dissipative decay with a time constant of seconds. The current is distributed and balanced among the twisted strands of the superconductor. The stabilization time for such a superconducting magnet has a time constant on the order of minutes. The effect on imaging during this time is primarily a $B_0$ field shift. This time period of instability is undesirable because it results in delays.

The present invention provides a new and improved apparatus and method which overcomes the above-referenced problems and others.

SUMMARY OF THE INVENTION

In accordance with one aspect of the present invention, a magnetic resonance imaging system includes a superconducting magnet which produces a magnetic field through an examination region. A radio frequency pulse controller and transmitter induce dipoles in the examination region to resonance such that radio frequency resonance signals are generated. Gradient magnetic field coils and a gradient magnetic field controller generate magnetic field gradient pulses across the examination region. A receiver receives and demodulates the radio frequency magnetic resonance signals. An image processor reconstructs image representations. A magnetic flux stabilizing means stabilizes the magnetic field in the examination region. The magnetic flux stabilizing means is inductively coupled to the superconducting magnet.

In accordance with another aspect of the invention, the superconducting magnet includes primary superconducting coils for producing the magnetic field.

In accordance with another aspect of the invention, the superconducting magnet includes shielding superconducting coils around the primary superconducting coils. A geometry of the current density of the shielding and primary superconducting coils is adjustable to optimize the magnetic field.

In accordance with a more limited aspect of invention, the primary and shielding coils are connected electrically in series with each other and a first persistence switch. The primary and shielding coils are connected with a source/storage of electrical power for selectively ramping-up a current in the primary and shielding superconducting coils when the first persistence switch is opened. The source/storage of electrical power also receives electrical power from the primary and shielding coils to ramp-down the magnetic flux when the first persistence switch is opened. The primary and shielding superconducting coils form a closed loop when the first persistence switch is closed and function as a superconducting magnet.

One advantage of the present invention is that the magnetic flux in the examination region stabilizes in a relatively short period of time after the superconducting magnet is ramped-up.

Another advantage of the present invention resides in the improved magnetic field drift compensation.

Another advantage resides in facilitating interventional surgery.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
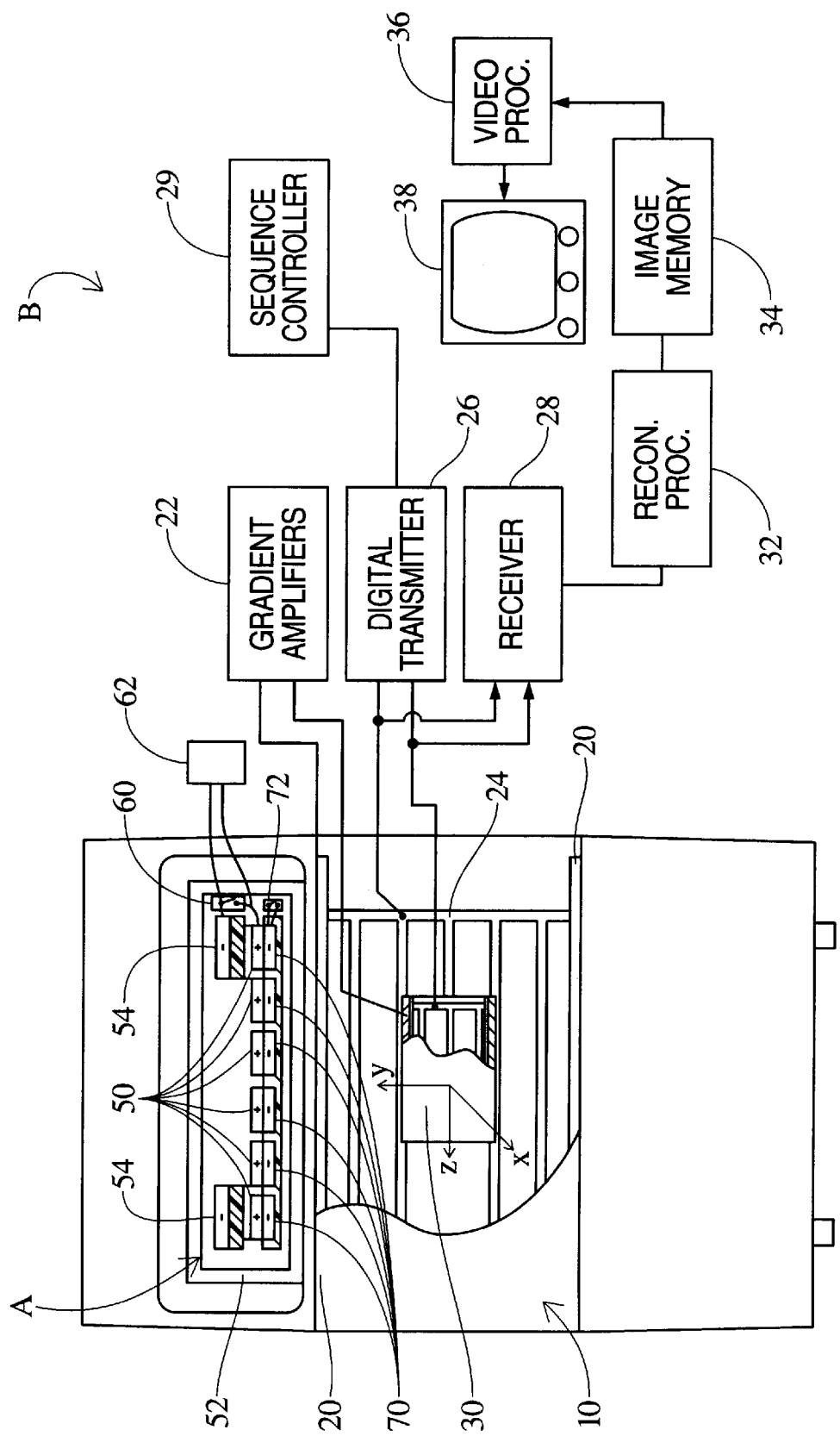
FIG. 1 is a diagrammatic illustration of a magnetic resonance imaging apparatus with a bore magnet configuration in accordance with the present invention.

With reference to FIG. 1, a patient or subject is received in an examination region 10. Magnets and magnetic flux stabilizers A generate a magnetic flux in the examination region 10 and compensate for drifts of the magnetic field. The flux stabilizers A create and stabilize a magnetic field through the examination region. Magnetic resonance electronics B selectively induce magnetic resonance of dipoles in the gap to generate resonance signals from which an image or other diagnostic information is created.

A gradient field coil 20 is selectively driven by gradient amplifiers 22 to generate linear magnetic field gradients across the examination region 10, preferably along three mutually orthogonal axes. A radio frequency coil 24 is connected with a digital transmitter 26 for selectively generating radio frequency signals for inducing and manipulating magnetic resonance in dipoles of the subject which are selectively aligned with the $B_0$ field. The radio frequency coil 24 is also connected with a receiver 28 for receiving and demodulating received magnetic resonance signals. The gradient amplifiers 22 and digital transmitter 26 are controlled by a sequence controller 29. Optionally, the gradient magnetic field coils and/or the radio frequency coils can be mounted in a smaller coil 30 designed to receive a selected portion of the subject being imaged.

The received magnetic resonance signals are digitized and processed by a reconstruction process 32 to generate a magnetic resonance image representation for storage in an image memory 34. A video processor 36, under control of an operator, retrieves selected portions of the data from the image memory and converts them into an appropriate format for display on a video monitor 38. Typical displays include reconstructed images of slices through the examined region, projection or shadowgraphical images, surface rendering images, and the like.

Figure 2:
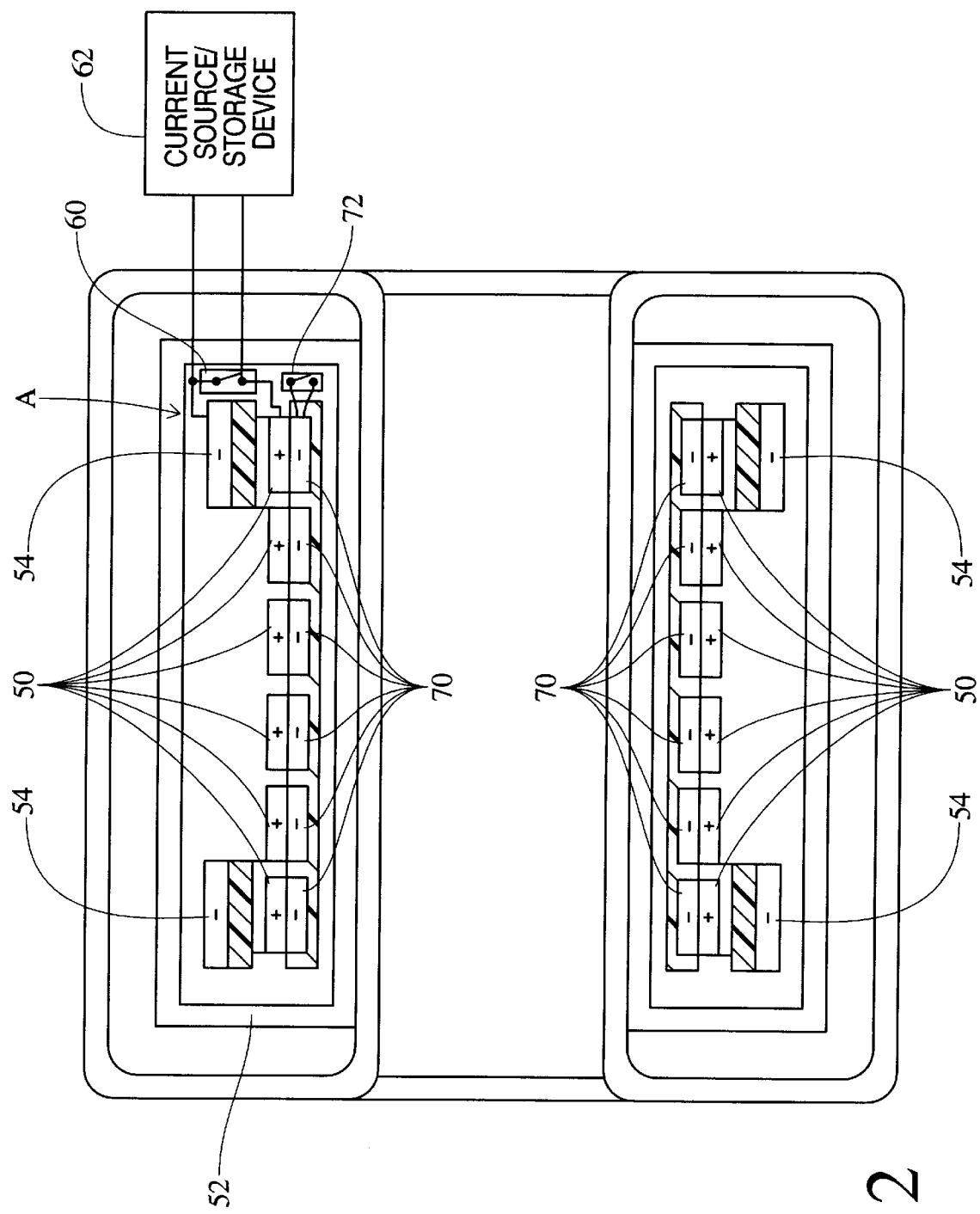
FIG. 2 is a partial cross-sectional view illustrating details of the superconducting magnet of FIG. 1; and, FIG. 3 is a diagrammatic illustration of a magnetic resonance imaging apparatus with a C-magnet configuration in accordance with the present invention.

With reference to FIGS. 1 and 2, the magnet and magnetic flux stabilizers A include coils 50 of a main or primary superconducting magnet. The superconducting magnet coils 50 are disposed in an annular helium can 52 to maintain the main coil at superconducting temperatures. Superconducting shield coils 54 extend annularly around the main superconducting coil 50. The primary and shield superconducting magnetic coils induce the magnetic flux along their central axes. More specifically, current density and a geometry of the primary and shield superconducting coils are adjusted such that they produce uniform field in the examination region and subtractively interact to reduce fringe field. In this manner, the shield superconducting coils act to cancel the magnetic field radially and axially outward therefrom.

The primary and shielding superconducting magnet coils are connected in series with each other. More specifically to the preferred embodiment, the series interconnection includes high temperature superconductors extending into the helium can 52 to a persistence switch 60. The superconductors become superconducting below about 80° K. When the persistence switch is closed and sufficiently cooled, the primary and shielding superconducting magnetic field coils define a closed, superconducting loop. When the superconducting coils are to be brought up to field, the persistence switch 60 is open or resistive as the coils are connected with a source/storage device 62 of electrical energy. Once the coils are brought up to full current, the persistence switch 60 is closed and the source of electrical energy is disconnected. When it is desired to shut off the main magnetic field, the primary and shield superconducting coils are again connected with the electrical storage device 62 and the persistence switch 60 is opened. Suitable electrical energy storage devices include capacitors, the electrical power grid, electrochemical (battery) storage, and the like.

A magnetic flux stabilizing coil 70 is magnetically, not electrically, connected with the primary superconducting magnetic field coil 50. For economy and manufacturing simplicity, the stabilizing coil is mounted in the same helium can 52 as the primary superconducting magnet 50, but closer to the central axis.

The multiple windings of the stabilizing coil 70 are connected in series with each other and in series with a second persistence switch 72. The persistence switch 72 is in its open or resistive state when the electrical energy storage device 62 is connected with the primary and shield superconducting magnets and is closed as or after the first persistence switch 60 is closed. Preferably, leads of the first and second persistence switches and their immediately adjacent interconnecting wiring is constructed of a high temperature superconducting material.

When a desired magnetic field, such as 0.5 T, is achieved in the examination region 10, the first persistence switch 60 is closed. This sets the strength of the magnetic field in the flux path. However, the superconducting magnet 50, generally requires about an hour for its strength to stabilize exponentially to its steady state level. Closing the second persistence switch 72 connects the stabilizing coil 70 into a closed loop. The change in flux attributable to the decay of the main magnetic field induces a corresponding current in the stabilizing coil 70. The current through the stabilizing coil 70 induces an offsetting magnetic field which tends to hold the magnetic flux through the examination region 10 constant. The more the flux from the main coil decreases, the more current is generated in the stabilizing coil 70. In this manner, the stabilizing coil and the primary coil taken together produce a substantially constant in space and time magnetic flux.

The magnet may be charged and discharged several times during a typical day of interventional surgery. Therefore, high temperature superconducting leads are included in the magnets to reduce liquid helium boil off during the fast ramp-up and ramp-down cycles. A warm end of the leads is thermally connected to the first stage of the cold heads to keep them in a superconducting state over their entire length. A transition piece is attached to one end. The transition piece ends in a connector at room temperature. During the ramp-down cycle, current is stored in the external current storing device 62.

Figure 3:
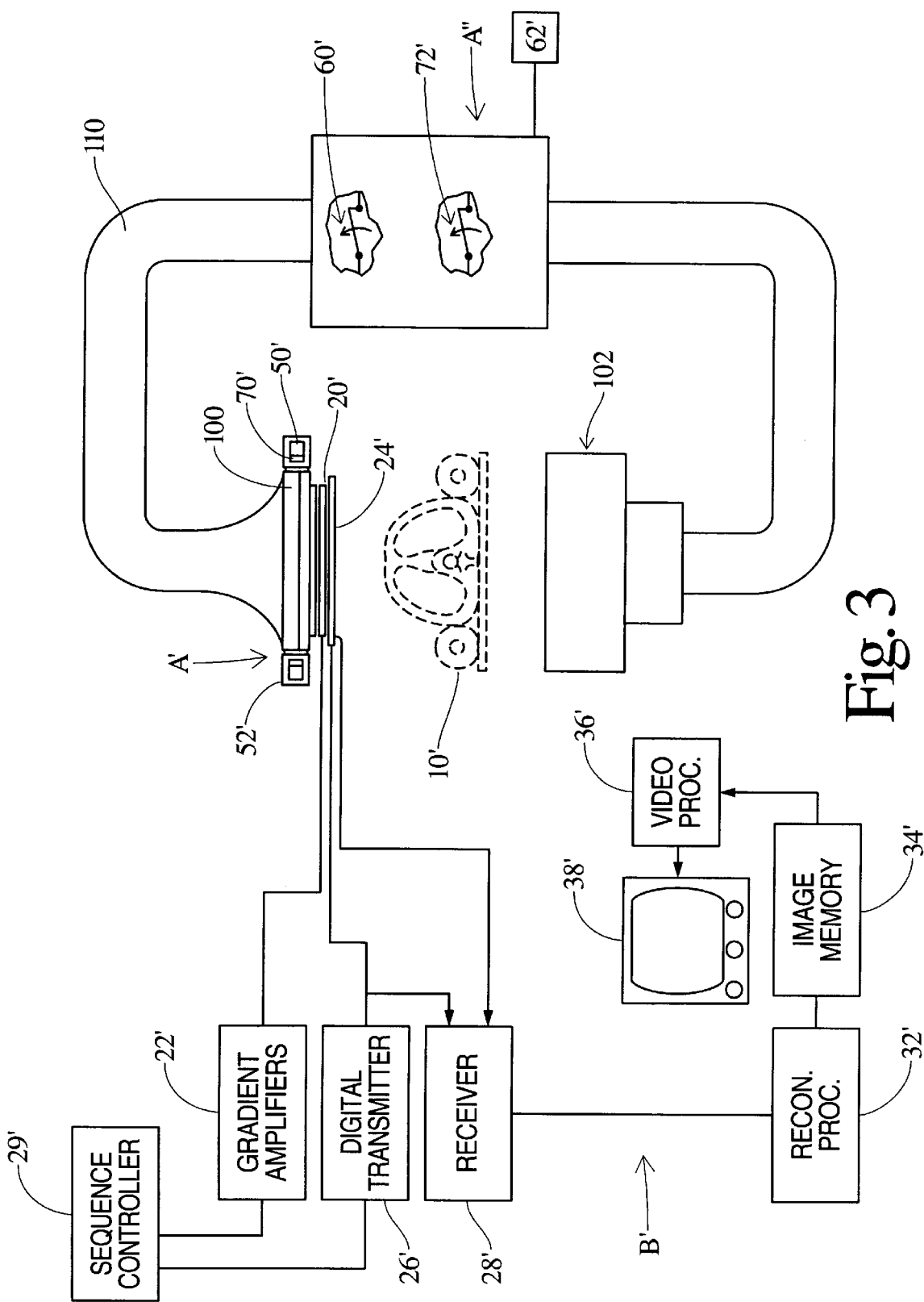

With reference to FIG. 3, the present invention is also applicable to other magnet configurations. For ease of understanding this embodiment of the present invention, like components are designated by like numerals with a primed (') suffix and new components are designated by new numerals. In the embodiment of FIG. 3, an examination region 10' is defined between a pair of pole pieces 100, 102. Each pole piece includes a magnet 50' and magnetic flux stabilizer 70' for generating a linear magnetic flux between the pole pieces. Optionally, the pole piece is shaped or contoured and the magnet distributed in order to improve the linearity of the magnetic flux through the examination region 10'. A gradient magnetic field coil 20' and a radio frequency magnetic field coil 24' are disposed adjacent the pole pieces 100, 102. Magnetic resonance electronics B' analogous to those illustrated in FIG. 1 are connected with the gradient and radio frequency coils. A circular magnet and magnet flux stabilizers A' include primary superconducting magnet coils 50' and stabilizing coils 70' analogous to those described in connection with FIG. 2. However, the layout of the coils is appropriate for generating a linear flux between the two pole pieces, rather than through the bore of a solenoid.

Optionally, a ferrous flux path 110 is provided between the pole pieces. In another embodiment, a superconducting magnet and flux stabilizer A" of a construction illustrated in FIG. 2 is mounted around the ferrous flux path 110. The magnet and magnetic flux stabilizers A" on the flux path can be used to generate and maintain the flux field between the pole pieces. Alternatively, the magnetic field between the pole pieces can be maintained in a combination of the magnet and flux stabilizers A' and A". As another alternative, one or both of the magnet and flux stabilizers A' and A" can include resistive magnets.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a superconducting magnet for producing a magnetic field through an examination region, a radio frequency pulse controller and transmitter for inducing dipoles in the examination region to resonance such that radio frequency resonance signals are generated, gradient magnetic field coils and a gradient magnetic field controller for generating magnetic field gradient pulses across the examination region, a receiver for receiving and demodulating the radio frequency magnetic resonance signals, and an image processor for reconstructing image representations, the improvement comprising:

a first persistence switch, electrically connected to the superconducting magnet and a source/storage of electrical power, for selectively ramping-up a current and ramping-down an electrical power in the superconducting magnet; and a magnetic flux stabilizing means for stabilizing the magnetic field in the examination region after the current is ramped-up, the magnetic flux stabilizing means being inductively coupled to the superconducting magnet.

2. In the magnetic resonance imaging system as set forth in claim 1, the improvement further comprising:

the superconducting magnet including primary superconducting coils for producing the magnetic field.

3. In the magnetic resonance imaging system as set forth in claim 2, the improvement further comprising:

the superconducting magnet including shielding superconducting coils around the primary superconducting coils, a geometry and current density of the shielding and primary superconducting coils being adjustable to optimize the magnetic field.

4. In the magnetic resonance imaging system as set forth in claim 3, the improvement further comprising:

the primary and shielding superconducting coils being connected electrically in series with each other and the first persistence switch; and, the primary and shielding coils being connected with the source/storage of electrical power for selectively ramping-up the current in the primary and shielding superconducting coils when the first persistence switch is opened and for receiving the electrical power from the primary and shielding superconducting coils to ramp-down the magnetic flux when the first persistence switch is opened, the primary and shielding superconducting coils forming a closed loop when the first persistence switch is closed to function as a superconducting magnet.

5. In the magnetic resonance imaging system as set forth in claim 4, the improvement further comprising:

the magnetic flux stabilizing means including stabilizing superconducting coils disposed adjacent the magnetic field, such that as the magnetic field fluctuates, currents are electromagnetically induced in the stabilizing superconducting coils, the currents inducing a stabilizing magnetic field in the examination region for offsetting the fluctuations, the stabilizing superconducting coils being connected in series with a second persistence switch, the second persistence switch being opened during the ramping-up and the ramping-down of the primary and shielding superconducting coils.

6. A magnetic resonance imaging system which includes a superconducting magnet with primary coils for producing a magnetic field through an examination region, a radio frequency pulse controller and transmitter for inducing dipoles in the examination region to resonance such that radio frequency resonance signals are generated, gradient magnetic field coils and a gradient magnetic field controller for generating magnetic field gradient pulses across the examination region, a receiver for receiving and demodulating the radio frequency magnetic resonance signals, and an image processor for reconstructing image representations, further comprising:

stabilizing superconducting coils disposed adjacent to and inductively coupled with the magnetic field, such that as the magnetic field fluxtuates, currents are electromagnetically induced in the stabilizing superconducting coils, the currents in the stabilizing coils inducing a stabilizing magnetic field in the examination region for offsetting the magnetic field fluctuations;

the primary coils being connected with a source/storage of electrical power for selectively ramping-up current in the primary superconducting coils when the first persistence switch is opened and for receiving electrical power from the primary superconducting coils to ramp-down the magnetic field when the first persistence switch is opened, the primary superconducting coils forming a closed loop when the first persistence switch is closed to form a superconducting loop; and, the stabilizing superconducting coils being connected in series with a second persistence switch, the second persistence switch being opened during ramping-up and ramping-down of the primary superconducting coils.

7. A magnetic resonance imaging system comprising:

a pair of spaced pole pieces defining an examination region in between;

a flux return path connected between the pole pieces;

a superconducting coil being disposed at least one of (i) in the pole pieces and (ii) along the flux path for producing a magnetic field through the flux return path and examination region;

a radio frequency pulse controller and transmitter for including dipoles in the examination region to resonance such that radio frequency resonance signals are generated;

gradient magnetic field coils and a gradient magnetic field controller for generating magnetic field gradient pulses across the examination region;

a receiver for receiving and demodulating the radio frequency magnetic resonance signals;

an image processor for reconstructing image representations; and, a magnetic flux stabilizing means for stabilizing the magnetic field in the examination region, the magnetic flux stabilizing means being inductively coupled to the superconducting coil.

8. The magnetic resonance imaging system as set forth in claim 7, wherein:

the magnetic flux stabilizer means includes stabilizing superconducting coils magnetically coupled with the flux path such that as the magnetic field fluctuates, currents are electromagnetically induced in the stabilizing superconducting coils, the induced currents inducing a stabilizing magnetic flux in the flux path which offsets the fluctuations in the magnetic field.

9. A magnetic resonance apparatus comprising:

a subject support which supports a subject in an examination region;

a superconducting magnet for selectively generating a preselected magnetic field through the examination region;

a source/storage device for electrical power;

a switch electrically connected to the superconducting magnet and the source/storage device for selectively increasing and decreasing current flowing in the superconducting magnet for selectively increasing and decreasing the magnetic field in the examination region; and, at least one stabilizing coil, inductively coupled with the superconducting magnet for stabilizing the magnetic field in the examination region after the magnetic field has been chanced.

10. The magnetic resonance apparatus as set forth in claim 9 wherein:

the superconducting magnet includes primary superconducting coils for producing the magnetic field.

11. The magnetic resonance apparatus as set forth in claim 10 wherein:

the superconducting magnet includes at least one shielding superconducting coil surrounding the primary superconducting coils, a current density and geometry of the shielding and primary superconducting coils being adjustable to reduce magnetic interaction between the superconducting magnet and ferromagnetic objects and maximize the magnetic field, the at least one shielding coil being electrically connected in series with the primary superconducting coils.

12. The magnetic resonance apparatus as set forth in claim 10 wherein the switch includes:

a first persistence switch electrically connected in series with the primary superconducting coils, the primary superconducting coils forming a closed loop when the first persistence switch is closed to form a superconducting loop.

13. The magnetic resonance apparatus as set forth in claim 12 wherein:

the primary coils are connected with the source of electrical power for selectively ramping-up the current in the primary superconducting coils when the first persistence switch is opened and for receiving electrical power from the primary superconducting coils to ramp-down the magnetic field when the first persistence switch is opened.

14. The magnetic resonance apparatus as set forth in claim 13 wherein:

currents are electromagnetically induced in the at least one stabilizing coil as the magnetic field fluctuates, the currents inducing magnetic flux into the magnetic field for offsetting the fluctuations.

15. The magnetic resonance apparatus as set forth in claim 14 wherein:

the at least one stabilizing coil is connected in series with a second persistence switch, the second persistence switch being opened during ramping-up and ramping-down of the primary superconducting coils.

16. A method for stabilizing magnetic flux in a subject receiving region during magnetic resonance imaging, for use in a system which includes a superconducting magnet for producing a magnetic flux in an examination region, stabilizing superconducting coils disposed adjacent the flux path for stabilizing the magnetic flux, a radio frequency controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region, a receiver for receiving and demodulating the radio frequency magnetic resonance signals, and an image processor for reconstructing image representations, the method comprising:

ramping-up a current in the superconducting magnet to a preselected level to generate a selected magnetic flux through the examination, the generated magnetic flux oscillating above and below the selected magnetic flux; and, stabilizing the magnetic flux in the examination region with the stabilizing superconducting coils such that the oscillating flux is damped to the selected magnetic flux.

17. The method for stabilizing magnetic flux according to claim 16, wherein the step of ramping-up includes:

opening a first persistence switch, connected electrically in series with primary superconducting coils of the magnet and opening a second persistence switch, connected in series with the stabilizing superconducting coils that are magnetically coupled with the magnetic flux;

passing current from a source of electrical power to the primary superconducting coils; and, closing the first and second persistence switches so the primary superconducting coils and the stabilizing coils form closed loops.

18. The method for stabilizing magnetic flux according to claim 17, wherein the stabilizing step includes:

reducing fluctuations in the ferromagnetic flux by electromagnetically inducing currents in the stabilizing superconducting coils, which induced currents generate offsetting magnetic flux components.

19. The method for stabilizing magnetic flux according to claim 18, the method further including:

ramping-down the ferromagnetic flux, the ramping-down including:

opening the first and second persistence switches; and, passing the current from the primary superconducting coils to the source of electrical power.

20. An open magnetic resonance imaging system including: a superconducting magnet having superconducting coils for producing a magnetic field between a pair of spaced pole pieces where an examination region is defined, a flux return path connected between the pole pieces, the superconducting coil being disposed at least one of (i) in the pole pieces and (ii) along the flux path, a radio frequency pulse controller and transmitter for inducing dipoles in the examination region to resonance such that radio frequency resonance signals are generated, gradient magnetic field coils and a gradient magnetic field controller for generating magnetic field gradient pulses across the examination region, a receiver for receiving and demodulating the radio frequency magnetic resonance signals, and an image processor for reconstructing image representations, and further including:

a magnetic flux stabilizing means for stabilizing the magnetic field in the examination region between the pole pieces, the magnetic flux stabilizing means being inductively coupled to the superconducting magnet.

* * * * *